(12) United States Patent
Nguyen et al.

(10) Patent No.: US 7,907,461 B1
(45) Date of Patent: Mar. 15, 2011

(54) STRUCTURES AND METHODS OF PREVENTING AN UNINTENTIONAL STATE CHANGE IN A DATA STORAGE NODE OF A LATCH

(75) Inventors: Chi Minh Nguyen, San Jose, CA (US); Martin L. Voogel, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 134 days.

(21) Appl. No.: 12/041,614

(22) Filed: Mar. 3, 2008

(51) Int. Cl.
*G11C 7/02* (2006.01)

(52) U.S. Cl. .......... 365/206; 365/194; 365/76; 365/154; 365/63

(58) Field of Classification Search .................. None
See application file for complete search history.

(56) References Cited

U.S. PATENT DOCUMENTS

| 6,326,809 | B1 | 12/2001 | Gambles et al. | |
| 6,525,586 | B1 * | 2/2003 | Ahmed et al. | 327/280 |
| 2008/0239843 | A1 * | 10/2008 | Fujiwara | 365/193 |

OTHER PUBLICATIONS

Naseer and Draper, "The DF-dice storage element for immunity to soft errors" 2005 48th IEEE International Midwest Symposium on Circuits and Systems (IEEE Cat. No. 05CH37691), 2005, vol. 1, p. 303-6 vol. 1, 13 refs, pp. 2 vol. (lxxxiv+1935), ISBN: 0-7803-9197-7. Publisher: IEEE, Piscataway, NJ, USA.*
D. R. Blum , M. J. Myjak and J. G. Delgado-Frias "Enhanced fault-tolerant data latches for deep submicron CMOS," Proc. 2005 Int. Conf. Computer Design Las Vegas, NV, Jun. 2005, p. 28.*
D. R. Blum and J. G. Delgado-Frias "Comparison of SET-resistant approaches for memory-based architectures," Proc. 12th NASA Symp. VLSI Design Coeur d"Alene, ID, Oct. 2005.*
D. R. Blum and J. G. Delgado-Frias, "Schemes for Eliminating Transient-Width Clock Overhead from SET-Tolerant Memory Based Systems," IEEE Transactions on Nuclear Science, vol. 53, No. 3, pp. 1564-1573, Jun. 2006.*
P. Mongkolkachit and B. Bhuva "Design technique for mitigation of alpha-particle-induced single-event transients in combinational logic," IEEE Trans. Device Mater. Reliab., vol. 3, pp. 89, Sep. 2003.*
Naseer and Draper, "The DF-dice storage element for immunity to soft errors" 2005 48th IEEE International Midwest Symposium on Circuits and Systems (IEEE Cat. No. 05CH37691), 2005, vol. 1, p. 303-6 vol. 1, 13 refs, pp. 2 vol. (lxxxiv+1935), ISBN: 0-7803-9197-7. Publisher: IEEE, Piscataway, NJ, USA. 20050000.*
Calin, T., et al., "Upset Hardened Memory Design for Submicron CMOS Technology",IEEE Transactions on Nuclear Science, vol. 43, No. 6, Dec. 1996, pp. 2874-2878, available from IEEE, 3 Park Avenue, 17th Floor, New York, NY 10016-5997.

* cited by examiner

*Primary Examiner* — Hoai V Ho
*Assistant Examiner* — James G Norman
(74) *Attorney, Agent, or Firm* — John J. King

(57) ABSTRACT

A method of preventing an unintentional state change in a data storage node of a latch is disclosed. The method comprises receiving a reference input signal; generating a delayed input signal based upon the reference clock signal; maintaining a state of a first data storage node of a plurality of data storage nodes by latching data at the first node using the reference input signal; and maintaining a state of a second data storage node of the plurality of data storage nodes by latching data at the second data storage node using the delayed input signal. A circuit for preventing an unintentional state change in a data storage node of a latch is also disclosed.

20 Claims, 7 Drawing Sheets

STRUCTURES AND METHODS OF PREVENTING AN UNINTENTIONAL STATE CHANGE IN A DATA STORAGE NODE OF A LATCH

FIELD OF THE INVENTION

The present application is related to integrated circuits, and in particular, to a latch and a method of preventing an unintentional state change in a data storage node of a latch.

BACKGROUND

For an integrated circuit to function properly, it is necessary that the data loaded into a memory is not corrupted. One type of integrated circuit which relies on data loaded into memory elements is a programmable logic device (PLD). A PLD is designed to be user-programmable so that users may implement logic designs of their choice. Programmable logic circuits of a PLD comprise gates which are configurable by a user of the circuit to implement a specific circuit design. One type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. In some CPLDs, configuration data is stored on-chip in non-volatile memory, then downloaded to volatile memory as part of an initial configuration sequence. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose.

PLDs also have different "modes" depending on the operations being performed on them. A specific protocol allows a programmable logic device to enter into the appropriate mode. Typical PLDs have internal blocks of configuration memory which specify how each of the programmable cells will emulate the user's logic. During a "program" mode, a configuration bitstream is provided to non-volatile memory, such as a read-only memory (ROM) (e.g., a programmable ROM (PROM), an erasable PROM (EPROM), or an electrically erasable PROM (EEPROM)) either external or internal to the programmable logic device. Each address is typically accessed by specifying its row and column addresses. During system power up of a "startup" mode, the configuration bits are successively loaded from the non-volatile memory into static random access memory (SRAM) configuration latches of a configuration logic block.

Certain applications of programmable logic devices, such as military, aerospace, and high-reliability communications, must be able to operate reliably in environments subjected to various radiation effects caused by energetic heavy ions and subatomic particles striking the silicon. When an ion strikes a circuit, it may cause a glitch in voltage at a node which results in an unintentional state change in a data storage node. This type of error is commonly known as a soft error. Because it is highly unlikely that more than one ion will strike the circuit simultaneously, it is only necessary to consider one ion strike leading to a single-event effect (SEE). Two of the most common single-event effects are single-event upsets (SEU), which refer to the loss of data in a storage element caused by an ion striking the storage element directly, and single-event transients (SET), which refer to the loss of data caused by a glitch on the clock or other input signals as a result of an ion strike, changing the internal node voltages of the circuit for a short time interval. As a result, information stored in memory cells, latches and flip-flops might be lost, causing incorrect system operation.

System level solutions, such as error detection and correction or triple modular redundancy (TMR), are available to provide SEU and SET tolerance. TMR is a technique for ensuring that a circuit functions even if one part of the circuit is not operating properly, where a majority vote will ensure that the output of the circuit is correct even when one copy of the circuit fails. For example, if an SEU or SET upsets a state machine, the state machine will resynchronize with its redundant partners while the whole TMR system still generates correct outputs. Therefore, state logic may operate uninterrupted in the presence of SEUs and SETS. However, implementing a circuit in triple modular redundancy may be a costly and difficult task.

There are also design techniques that may be applied at circuit level to prevent storage elements from being affected by an SEU, to enhance the system level soft-error tolerant solution. To prevent an SEU, a dual interlocked storage cell (DICE), which is described by Calin, Nicolaidis and Velazco in "Upset Hardened Memory Design for Submicron CMOS Technology" (IEEE Trans. On Nuclear Science, Vol. 43, No. 6, December 1996), may be used. When an SEU strike hits and disturbs the voltage on one of the internal nodes of the dual interlocked storage cell, the circuit will return to its previous state after the SEU generated charge has been collected and dissipated. Therefore, disturbing only one data storage node will not change the stored data. However, a dual interlocked storage cell does not prevent storage elements from being affected by SET upsets.

Accordingly, there is a need for an improved latch and method of preventing an unintentional state change in a data storage node of a latch.

SUMMARY

A method of preventing an unintentional state change in a data storage node of a latch is disclosed. The method comprises receiving a reference input signal; generating a delayed input signal based upon the reference input signal; maintaining a state of a first data storage node of a plurality of data storage nodes by latching data at the first node using the reference input signal; and maintaining a state of a second data storage node of the plurality of data storage nodes by latching data at the second data storage node using the delayed input signal.

According to an alternate embodiment, a method of preventing an unintentional state change in a data storage node of a latch comprises receiving a reference clock signal; generating a delayed clock signal based upon the reference clock signal; receiving an input data signal; generating a delayed data signal based upon the input data signal; maintaining a state of a first data storage node of a plurality of data storage nodes by latching data at the first data storage node of the plurality of data storage nodes using the reference clock signal and the input data signal; and maintaining a state of a second data storage node of the plurality of data storage nodes by latching data at the second data storage node using the delayed clock signal and the delayed data signal.

A latch for storing data in an integrated circuit is also disclosed. The latch comprises a storage cell having a plurality of data storage nodes; an input terminal coupled to a first data storage node of the plurality of data storage nodes, the first data storage node storing data of an input data signal; a delay circuit being coupled to receive a reference clock signal and output a delayed clock signal based upon the reference clock signal and a delay of the delay circuit; and an output terminal coupled to a second data storage node of the plurality of data storage nodes, the latch generating an output signal at the output terminal based upon the reference clock signal and the delayed clock signal.

DETAILED DESCRIPTION OF THE DRAWINGS

Figure 1:
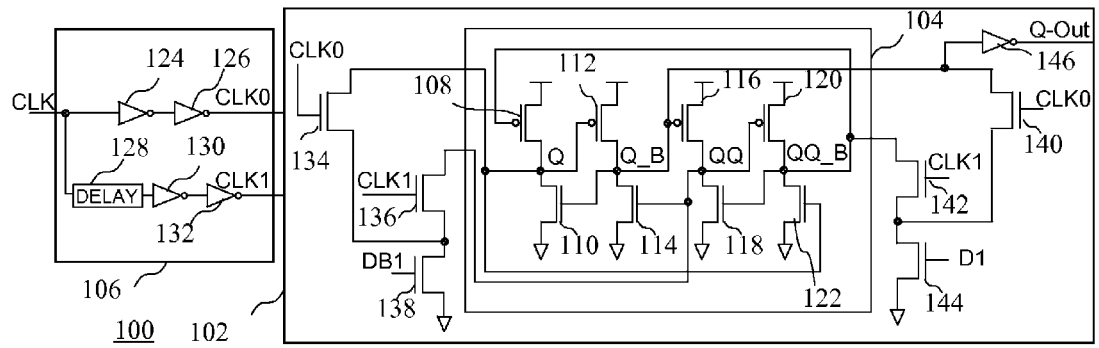
FIG. 1 is a block diagram of a latch preventing a glitch on the clock which may cause an unintentional state change in a data storage node according to an embodiment of the present invention.

Turning first to FIG. 1, a block diagram 100 of a latch preventing an unintentional state change in a data storage node according to an embodiment of the present invention is shown. The latch 102 comprises a memory cell 104, configured as a conventional dual interlocked storage cell, controlled by a clock generation circuit 106. The circuit comprises cross-coupled CMOS stages comprising a p-channel transistor having a source coupled to a power node, an n-channel transistor having a source coupled to ground, and drains coupled together. In particular, a first stage comprises a p-channel transistor 108 and an n-channel transistor 110 having a node Q, a second stage comprises a p-channel transistor 112 and an n-channel transistor 114 having a node Q_B, a third stage comprises a p-channel transistor 116 and an n-channel transistor 118 having a node QQ, and a fourth stage comprises a p-channel transistor 120 and an n-channel transistor 122 having a node QQ_B. The gate of transistor 108 is coupled to node QQ_B, while the gate of transistor 110 is coupled to node Q_B. Similarly, the gate of transistor 112 is coupled to node Q, while the gate of transistor 114 is coupled to node QQ. The gate of transistor 116 is coupled to node Q_B, while the gate of transistor 118 is coupled to node QQ_B. Finally, the gate of transistor 120 is coupled to node QQ, while the gate of transistor 122 is coupled to node Q.

The memory cell 104 has two stable states. One state is when nodes Q_B and QQ_B are high and nodes Q and QQ are low. The other state is when nodes Q_B and QQ_B are low and nodes Q and QQ are high. To write to this cell, it is necessary to drive data to at least two of the four internal nodes. Therefore it has been demonstrated that by changing the voltage on only one of the nodes Q, Q_B, QQ, or QQ_B, the circuit will not change from one stable state to another. To write a 1, ports (nodes) Q_B and QQ_B are pulled down. To write a 0, ports Q and QQ are pulled down. Both CLK1 and CLK0 must be high to write. However, according to various embodiments of the present invention, circuit techniques comprising additional circuit elements make the memory cell 104 both SEU immune and SET immune.

As shown in FIG. 1, a reference clock signal CLK is coupled to the clock generation circuit 106 comprising a first path having inverters 124 and 126 to generate a first, undelayed clock signal CLK0. A delay element 128 enables the generation of a delayed clock signal CLK1 after inverters 130 and 132. The CLK0 signal is coupled to control the gate of a transistor 134 extending between node Q and a common node coupling the source of a transistor 136 and the drain of a transistor 138. The gate of transistor 136 is controlled by the delayed clock signal CLK1, while the gate of the transistor 138 is controlled by an inverted data signal D1B, providing a path from QQ to ground. Similarly, the CLK0 signal is coupled to control the gate of a transistor 140 extending between node Q_B and a common node coupling the source of a transistor 142 and the drain of a transistor 144. The gate of transistor 142 is controlled by the delayed clock signal CLK1 while the gate of the transistor 144 is controlled by an inverted data signal D1, providing a path from QQ_B to ground.

The circuit distinguishes valid and invalid signals by their pulse width. In some embodiments, the user may determine the maximum pulse width of unwanted glitches that may occur based on the operating environment and then program a delay block to match this pulse width. If a clock signal is low with wrong data on the data input, and the clock signal gets a low-to-high glitch caused by an SEU strike on the clock buffer, the wrong data will get into the latch. The latch uses this delay to ignore all signals with smaller pulse widths. That is, the pulse width of the reference clock signal may be selected to be greater than an anticipated glitch. Signals with pulse widths bigger than this delay are considered valid and the circuit responds accordingly. If CLK comprises a valid clock pulse which has a width much wider than the delay of the delay block, both CLK0 and CLK1 may be high at some given time, and data on node D may be written into the latch. If a voltage glitch with a pulse width smaller than the delay of the delay block 128 occurs on node CLK, the glitch will propagate to both CLK0 and CLK1. However, because the delay of the delay block is larger than the pulse width of the glitch, the glitch gets to CLK0 first and disappears on CLK0 before it appears on CLK1. Accordingly, the clock generation circuit 106 prevents the glitch from changing the data in the latch. An example of a delay element 128 and the timing of the circuit will be described in more detail in reference to FIGS. 9 and 10. The pulse width of the reference clock signal CLK has to be greater than some value determined by the difference between the reference and delayed versions of the clock signals to be able to change the data stored in the latch. A flip-flop based on this latch behaves the same way.

Figure 2:
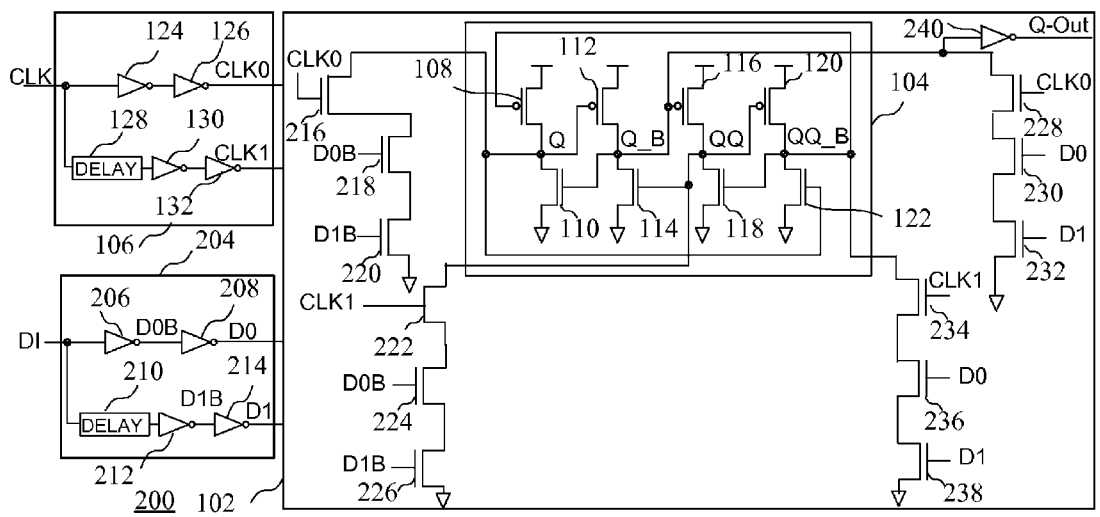
FIG. 2 is a block diagram of a latch having delayed clock and data signals preventing a glitch on either a clock or data signal which may cause an unintentional state change in a data storage node according to an embodiment of the present invention.

While the latch of FIG. 1 provides a clock which is protected from a SET strike, a glitch in a voltage may occur at any node, such as a data input. For example, if a glitch occurs on the data input D when the clock is making a high-to-low transition, wrong data will get loaded into the latch. Even when the clock is low, an SEU strike may cause a negative voltage on a data input node which may corrupt a one in the latch. As shown in FIG. 2, a block diagram 200 shows a latch having circuits for also preventing an unintentional state change in a data storage node according to an embodiment of the present invention. That is, the circuit of FIG. 2 has delayed clock and data signals to provide clock and data protection from a SET strike, not just clock protection as in the embodiment of FIG. 1. In particular, a data input signal DI is coupled to the delay data generation circuit 204 comprising a first path having inverters 206 and 208 to generate an inverted first, undelayed data signal D0B and a first, undelayed data signal D0. A delay element 210 enables the generation of an inverted second delayed data signal D1B after an inverter 212 and a second delayed data signal D1 after an inverter 214. According to the circuit of FIG. 2, the node Q is coupled to ground by way of a path comprising a first transistor 216 coupled to receive CLK0 at its gate, a second transistor 218 coupled to receive D0B at its gate, and a third transistor 220 coupled to receive D1B at its gate. The node QQ is coupled to ground by way of a path comprising a first transistor 222 coupled to receive CLK1 at its gate, a second transistor 224 coupled to receive D0B at its gate, and a third transistor 226 coupled to receive D1B at its gate. The node Q_B is coupled to ground by way of a path comprising a first transistor 228 coupled to receive CLK0 at its gate, a second transistor 230 coupled to receive D0 at its gate, and a third transistor 232 coupled to receive D1 at its gate. Finally, the node QQ_B is coupled to ground by way of a path comprising a first transistor 234 coupled to receive CLK1 at its gate, a second transistor 236 coupled to receive D0 at its gate, and a third transistor 238 coupled to receive D1 at its gate. An inverter 240 generates the output Q-out.

Accordingly, the circuit of FIG. 2 provides SEU and SET protection on both the reference clock and data inputs. If a glitch is smaller than the programmable delay generated by delay block 210, it will not appear at both D0B and D1B at any time. Similarly, the glitch will not appear at both D0 and D1 at any time. Therefore, even when CLK is high, a glitch on DI will not create a path from a port that is not intended to be pulled down to ground. Because each port of the storage element has a separate path to ground, an SEU strike on any path affects only one port, and therefore is not sufficient to change the state of the latch. Accordingly, the latch in FIG. 2 is completely SEU and SET immune.

Figure 3:
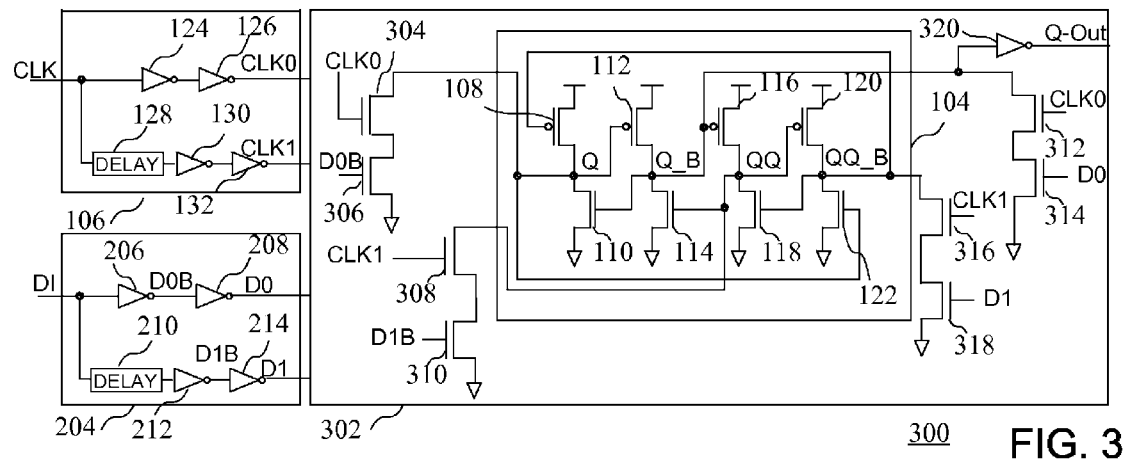
FIG. 3 is a block diagram of a latch having delayed clock and data signals preventing a glitch on either a clock or data signal which may cause an unintentional state change in a data storage node according to an alternate embodiment of the present invention.

Turning now to FIG. 3, a block diagram of a latch having delayed clock and data signals preventing an unintentional state change in a data storage node according to an alternate embodiment of the present invention is shown. In particular, the embodiment of FIG. 3 provides the same benefits as the circuit of FIG. 2, but requires fewer transistors. According to the circuit of FIG. 3, the node Q is coupled to ground by way of a path comprising a first transistor 304 coupled to receive CLK0 at its gate and a second transistor 306 coupled to receive D0B at its gate. The node QQ is coupled to ground by way of a path comprising a first transistor 308 coupled to receive CLK1 at its gate and a second transistor 310 coupled to receive D1B at its gate. The node Q_B is coupled to ground by way of a path comprising a first transistor 312 coupled to receive CLK0 at its gate and a second transistor 314 coupled to receive D0 at its gate. Finally, the node QQ_B is coupled to ground by way of a path comprising a first transistor 316 coupled to receive CLK1 at its gate and a second transistor 318 coupled to receive D1 at its gate. An inverter 320 generates the output Q-out.

Figure 4:
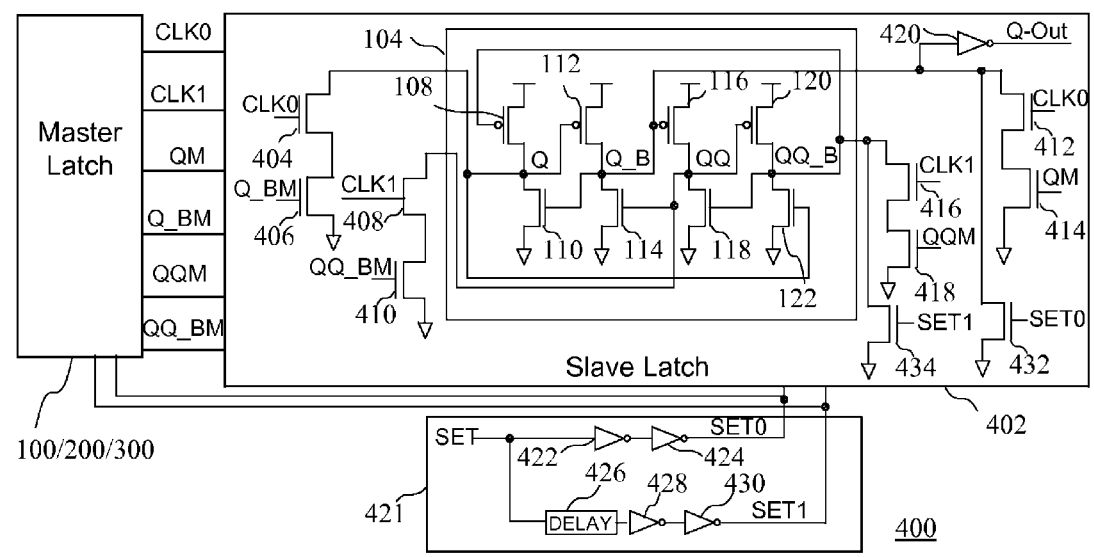
FIG. 4 is a master-slave flip-flop having circuit elements which prevent an unintentional state change in a data storage node according to an embodiment of the present invention.

Turning now to FIG. 4, a master-slave flip-flop having circuit elements which prevent an unintentional state change in a data storage node according to an embodiment of the present invention is shown. The master latch portion in FIG. 4 may comprise any of the latches in FIGS. 1-3, for example. Data to be written into the slave latch comes from all four ports of the master latch, and the signal at no more than one port will be disturbed by a single radiation event, as described above. Similar to the master latch, a glitch on CLK will not change stored data in the slave latch of the master-slave flip-flop of FIG. 4. In the slave latch of the circuit of FIG. 4, the node Q is coupled to ground by way of a path comprising a first transistor 404 coupled to receive CLK0 at its gate and a second transistor 406 coupled to receive Q_BM at its gate, where Q_BM is Q_B of the master latch. The node QQ is coupled to ground by way of a path comprising a first transistor 408 coupled to receive CLK1 at its gate and a second transistor 410 coupled to receive QQ_BM at its gate. The node Q_B is coupled to ground by way of a path comprising a first transistor 412 coupled to receive CLK0 at its gate and a second transistor 414 coupled to receive QM at its gate. Finally, the node QQ_B is coupled to ground by way of a path comprising a first transistor 416 coupled to receive CLK1 at its gate and a second transistor 418 coupled to receive QQM at its gate. An inverter 420 generates the output Q-out. Therefore, the flip-flop shown in FIG. 4 is provided SEU and SET immunity for clock and data signals.

FIG. 4 also shows how the latches of the flip-flop may be modified to implement an asynchronous set function which is also SEU and SET immune. The delay block that separates signals SET0 and SET1 is programmed to have a delay bigger than the pulse width of any glitch than may occur on SET. In particular, a set signal SET is coupled to the set generation circuit 421 comprising a first path having inverters 422 and 424 to generate a first, undelayed set signal SET0. A delay element 426 enables the generation of a delayed set signal SET1 after inverters 428 and 430. Therefore, a glitch on SET signal will not cause both ports Q_B and QQ_B to be pulled down at the same time and accidentally change the state of the latch. Asynchronous reset functionality (not shown) may be implemented in a similar way. By using multiple paths (Q1, QQ1, Q_B1, QQ_B1) to transfer data from the master to the slave latch, the use of delay blocks in the slave block may be avoided, which greatly reduces the cost of building the flip-flop, while maintaining SET and SEU protection even during the data transferring between the master and the slave latch.

Figure 5:
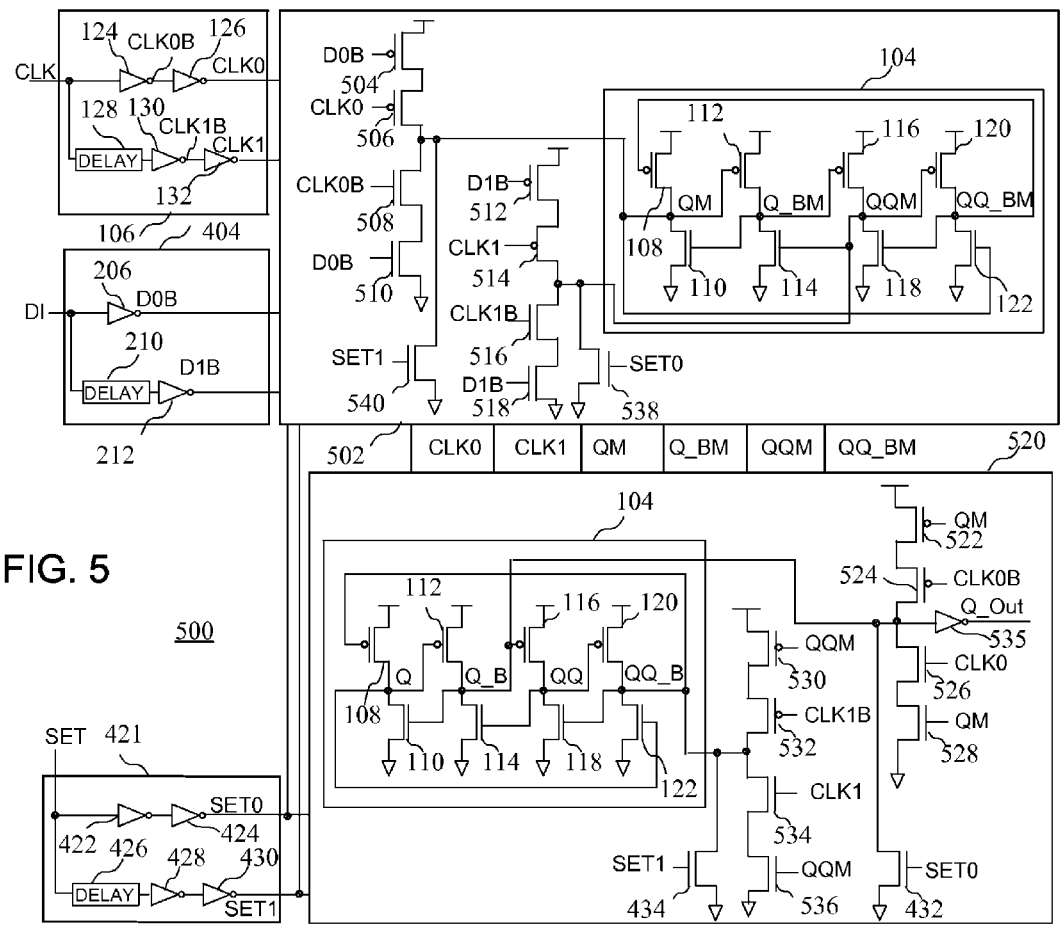
FIG. 5 is a master-slave flip-flop having circuit elements which prevent an unintentional state change in a data storage node according to an alternate embodiment of the present invention.

Turning now to FIG. 5, a master-slave flip-flop having circuit elements which prevent an unintentional state change in a data storage node according to an embodiment of the present invention is shown. In particular, according to the circuit of FIG. 5, the node QM of the master latch is coupled to a node of a path coupled between power and ground comprising a first transistor 504 coupled to receive D0B at its gate, a second transistor 506 coupled to receive CLK0 at its gate, a third transistor 508 coupled to receive CLK0B at its gate, and a fourth transistor 510 coupled to receive D0B at its gate. The node QQM is coupled to a node of a path coupled between power and ground comprising a first transistor 512 coupled to receive D1B at its gate, a second transistor 514 coupled to receive CLK1 at its gate, a third transistor 516 coupled to receive CLK1B at its gate, and a fourth transistor 518 coupled to receive D1B at its gate. The node Q_B of the slave latch 520 is coupled to a node of a path coupled between power and ground comprising a first transistor 522 coupled to receive QM at its gate, a second transistor 524 coupled to receive CLK0B at its gate, a third transistor 526 coupled to receive CLK0 at its gate, and a fourth transistor 528 coupled to receive QM at its gate. Finally, the node QQ_B is coupled to a node of a path coupled between power and ground comprising a first transistor 530 coupled to receive QQM at its gate, a second transistor 532 coupled to receive CLK1B at its gate, a third transistor 534 coupled to receive CLK1 at its gate, and a fourth transistor 536 coupled to receive QQM at its gate. An inverter 535 generates the output Q-out. Transistors 538 and 540 are coupled to receive SET0 and SET1, respectively, to set the values at the nodes QM and QQM.

While the circuit of FIG. 5 may consume more area than the circuit of FIG. 4 because of the larger PMOS devices required, it provides the same SEU and SET immunity, and is faster. That is, the circuit of FIG. 5 enables the output to be available before the slave latch completes its state transition. If the delay block is long, it takes a time which is slightly longer than the delay of the delay block for the slave latch to complete its state transition. The circuit of FIG. 5 overcomes this limitation and results in a much faster clock-to-output time. That is, a delayed clock signal is not required to generate Q_out at the output of inverter 535.

Figure 6:
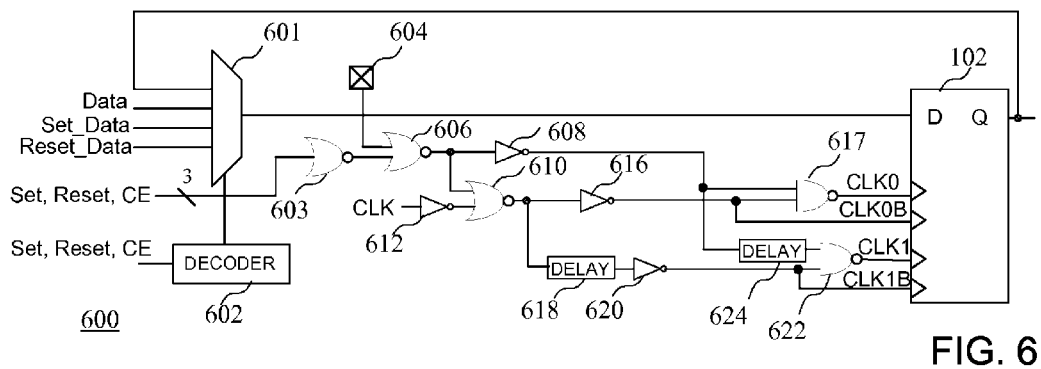
FIG. 6 is a block diagram of a complex flip-flop which has SET and SEU immune Set, Reset, and Clock Enable inputs that may be synchronous or asynchronous according to an embodiment of the present invention.

Turning now to FIG. 6, a block diagram of a complex flip-flop which has SET and SEU immune Set, Reset, and Clock Enable inputs that may be synchronous or asynchronous, according to an embodiment of the present invention, is shown. In an FPGA, a flip-flop typically has many features, and those features may be customized further by programming some memory cells. For example, a flip-flop may have Clock Enable, Set and Reset. Set and Reset may be customized to be synchronous or asynchronous by programming a memory cell. When there are many control signals involved, a delay block may be used to make each signal immune to SET. However, using many delay blocks may be prohibitively expensive. FIG. 6 shows an implementation of a flip-flop with programmable synchronous or asynchronous set and reset, for which the set and reset signals are both made SEU and SET immune without unnecessarily duplicating the delay block.

In particular, a multiplexer 601 for selecting an input to a simple master-slave flip-flop 102 is coupled to receive a Data signal, a Set_Data signal, and a Reset_Data signal, and is controlled by a decoder 602 receiving a control signal comprising a Set/Reset and Clock Enable. A Set/Reset signal and a Clock Enable CE signal are coupled to an exclusive OR gate 603, the output of which is coupled to an exclusive OR gate 606 which is also coupled to receive an input of a memory 604. The value of the memory 604 determines whether the circuit of FIG. 6 enables synchronous or asynchronous storing of data. If the memory signal is low, the flip-flop is in asynchronous mode. If the memory signal is high, the flip-flop is in synchronous mode. The output of the exclusive OR gate 606 is coupled to an inverter 608. The output of the OR gate 606 is also coupled to an exclusive OR gate 610 coupled to an inverter 612, receiving the clock signal CLK. The output of the exclusive OR gate 610 is coupled to an inverter 616, the output of which comprises the CLK0B signal, which is coupled to a NAND gate 617 also receiving the output of inverter 608 to generate the CLK0 signal. The exclusive OR gate 610 is also coupled to a delay circuit 618, the output of which is coupled to an inverter 620 for generating CLK1B as an input to an NAND gate 622. The NAND gate also receives the output of a delay circuit 624, which is a delayed version of the output of inverter 608.

The multiplexer 601 and the decoder 602 select an appropriate input to drive the flip-flop depending whether Clock Enable, Set or Reset is asserted. In synchronous mode, the clock controls when the data in the latches changes. In asynchronous mode when 604 is low, both the master and slave latch need to become transparent when set or reset is asserted so that the data may go from the input of the flip-flop to the output independent of the clock. One advantage of the circuit of FIG. 6 is that it allows the Set and Reset signal to force clk0, clk1, clkb0, and clkb1 high when asserted in a way that is immune to glitches. That is, a glitch on Set or Reset will not force clk0 and clk1 or clkb0 and clkb1 high at the same time because of the delay blocks in the paths. By implementing Clock Enable, Set, and Reset in the multiplexer 601 of the flip-flop, SET protection on the flip-flop data inputs also protects against glitches on the Clock Enable, Set, and Reset signals. While an additional delay block is required to be inserted in the clock path for SET protection, the circuit requires fewer delay blocks than if a delay block were used for each signal.

Figure 7:
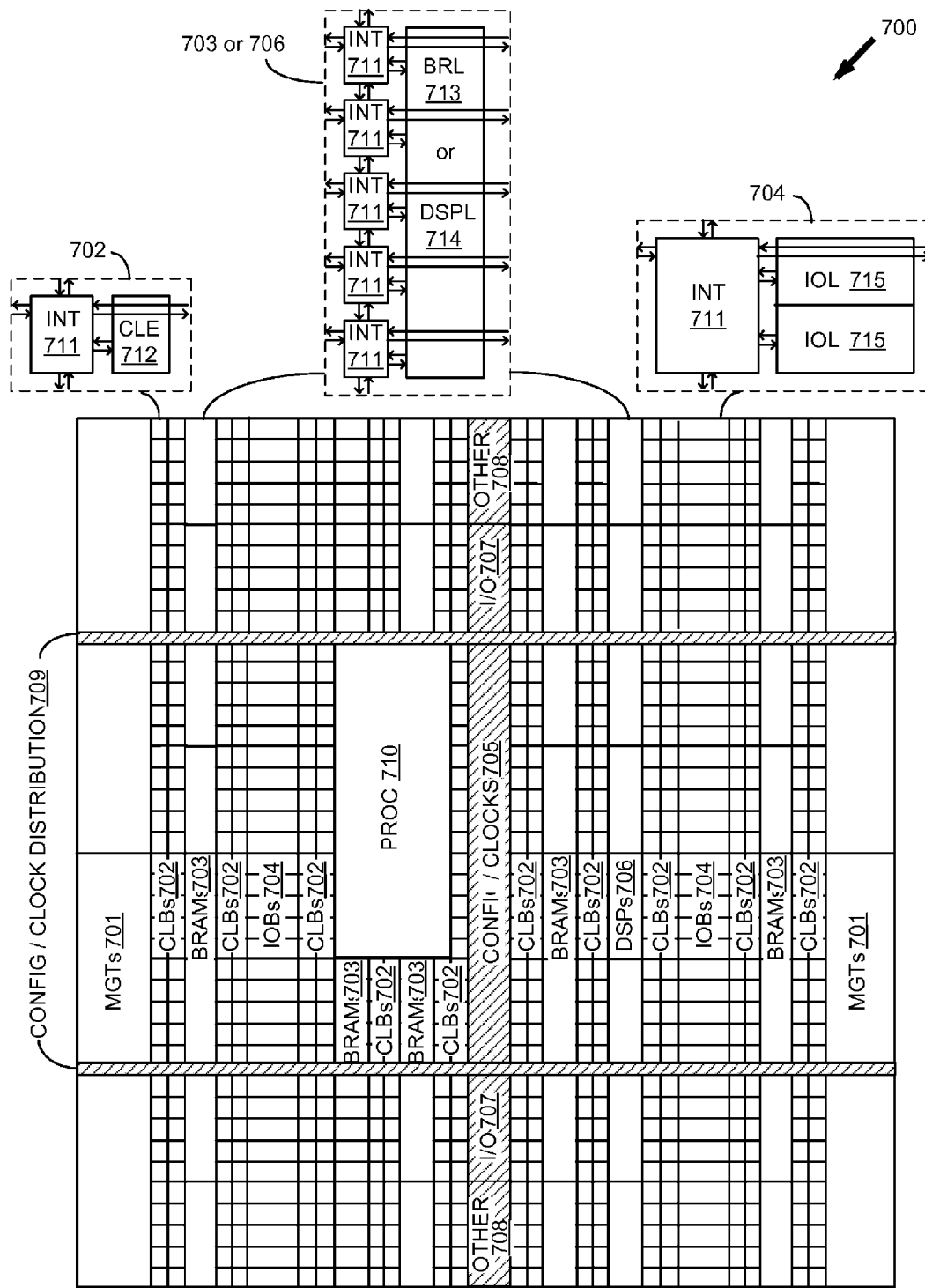
FIG. 7 is a block diagram of a programmable logic device implementing a latch according to an embodiment of the present invention.

Turning now to FIG. 7, a block diagram of a programmable logic device implementing a latch according to an embodiment of the present invention is shown. As noted above, advanced FPGAs may include several different types of programmable logic blocks in the array. For example, FIG. 7 illustrates an FPGA architecture that includes a large number of different programmable tiles comprising programmable logic including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707) (e.g., configuration ports and clock ports), and other programmable logic 708 such as digital clock managers, analog-to-digital converters, system monitoring logic, and so forth. Some FPGAs also include dedicated processor blocks (PROC 710).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element (INT 711) also includes the connections to and from the programmable logic element within the same tile, as shown by the examples included at the top of FIG. 7.

For example, a CLB 702 may include a configurable logic element (CLE 712) that may be programmed to implement user logic plus a single programmable interconnect element (INT 711). A BRAM 703 may include a BRAM logic element (BRL 713) in addition to one or more programmable interconnect elements. Typically, the number of interconnect elements included in a tile depends on the height of the tile. In the pictured embodiment, a BRAM tile has the same height as four CLBs, but other numbers (e.g., five) may also be used. A DSP tile 706 may include a DSP logic element (DSPL 714) in addition to an appropriate number of programmable interconnect elements. An IOB 704 may include, for example, two instances of an input/output logic element (IOL 715) in addition to one instance of the programmable interconnect element (INT 711). As will be clear to those of skill in the art, the actual I/O pads connected, for example, to the I/O logic element 715 typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks may be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 8:
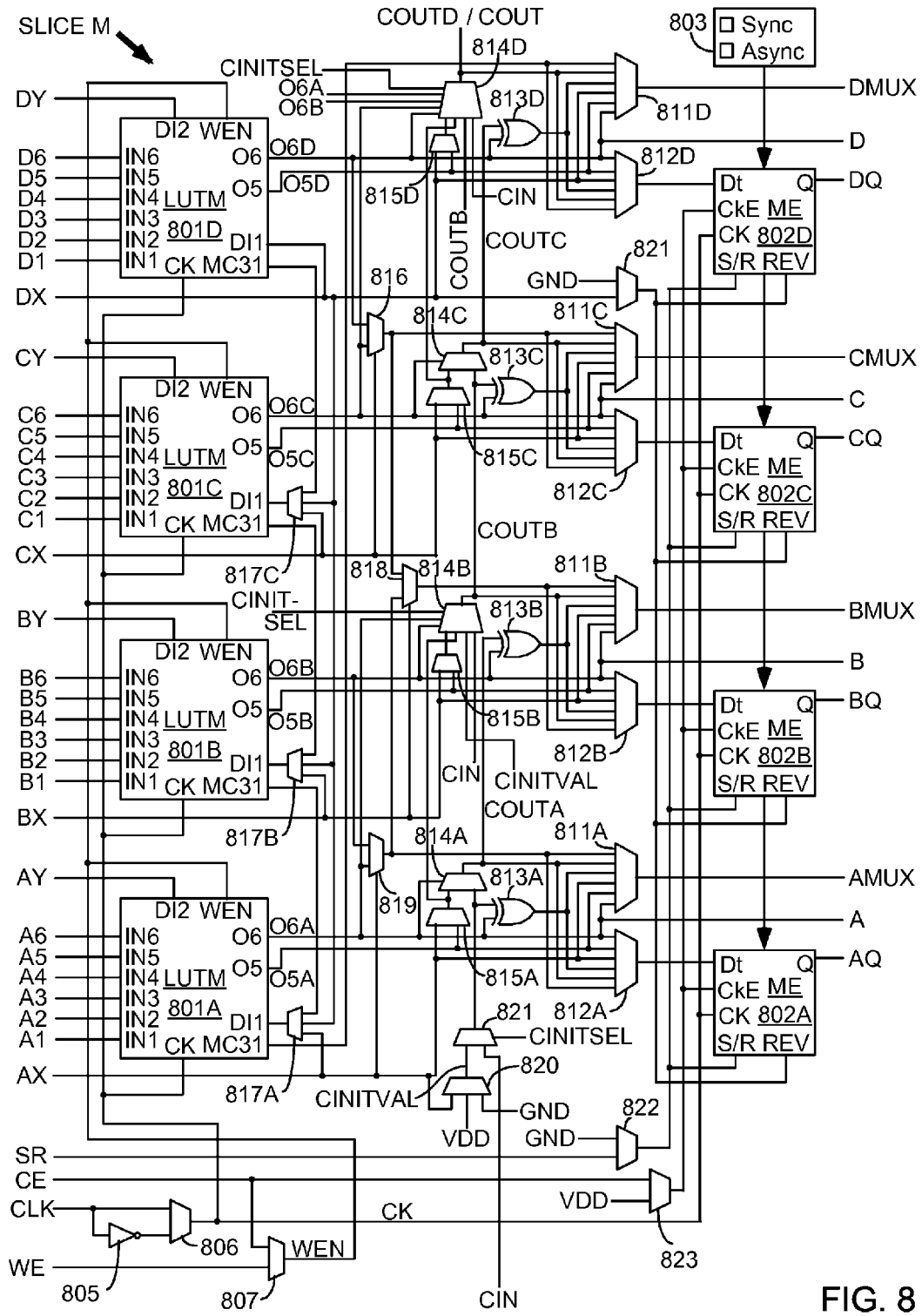
FIG. 8 is a block diagram of a configurable logic element of the programmable logic device of FIG. 7 according to an embodiment of the present invention.

Turning now to FIG. 8, a block diagram of a configurable logic element of the programmable logic device of FIG. 8 according to an embodiment of the present invention is shown. In particular, FIG. 8 illustrates in simplified form a configurable logic element of a configuration logic block 702 of FIG. 7. In the embodiment of FIG. 8, slice M includes four lookup tables (LUTMs) 801A-801D, each driven by six LUT data input terminals A1-A6, B1-B6, C1-C6, and D1-D6 and each providing two LUT output signals O5 and O6. The O6 output terminals from LUTs 801A-801D drive slice output terminals A-D, respectively. The LUT data input signals are supplied by the FPGA interconnect structure via input multiplexers, which may be implemented by programmable interconnect element 811, and the LUT output signals are also supplied to the interconnect structure. Slice M also includes: output select multiplexers 811A-811D driving output terminals AMUX-DMUX; multiplexers 812A-812D driving the data input terminals of memory elements 802A-802D; combinational multiplexers 816, 818, and 819; bounce multiplexer circuits 822-823; a circuit represented by inverter 805 and multiplexer 806 (which together provide an optional inversion on the input clock path); and carry logic comprising multiplexers 814A-814D, 815A-815D, 820-821 and exclusive OR gates 813A-813D. All of these elements are coupled together as shown in FIG. 8. Where select inputs are not shown for the multiplexers illustrated in FIG. 8, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 8 for clarity, as well as from other selected figures herein.

In the pictured embodiment, each memory element 802A-802D may be programmed to function as a synchronous or asynchronous flip-flop or latch. The selection between synchronous and asynchronous functionality is made for all four memory elements in a slice by programming Sync/Asynch selection circuit 803. When a memory element is programmed so that the S/R (set/reset) input signal provides a set function, the REV input terminal provides the reset function. When the memory element is programmed so that the S/R input signal provides a reset function, the REV input terminal provides the set function. Memory elements 802A-802D are clocked by a clock signal CK, which may be provided by a global clock network or by the interconnect structure, for example. Such programmable memory elements are well known in the art of FPGA design. Each memory element 802A-802D provides a registered output signal AQ-DQ to the interconnect structure. Because each LUT 801A-801D provides two output signals, O5 and O6, the LUT may be configured to function as two 5-input LUTs with five shared input signals (IN1-IN5), or as one 6-input LUT having input signals IN1-IN6.

In the embodiment of FIG. 8, each LUTM 801A-801D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 817A-817C for LUTs 801A-801C), or to the two 32-bit RAMs via input terminals DI1 and DI2. RAM write operations in the LUT RAMs are controlled by clock signal CK from multiplexer 806 and by write enable signal WEN from multiplexer 807, which may selectively pass either the Clock Enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 801A may also be provided to the general interconnect structure for shift register chaining, via output select multiplexer 811D and CLE output terminal DMUX. The devices having programmable logic and methods of the present invention may be implemented according to the device of FIGS. 7 and 8, or in any device, including any type of integrated circuit having programmable logic.

Figure 9:
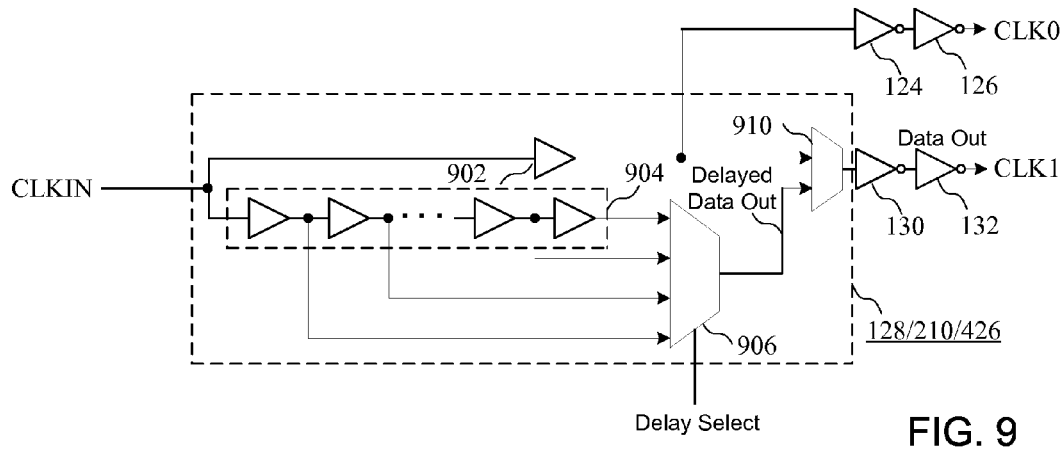
FIG. 9 is a block diagram of a delay element according to an embodiment of the present invention.

Turning now to FIG. 9, a block diagram of a delay element according to an embodiment of the present invention is shown. In particular, the input data signal, such as a clock or data signal, is coupled to a first delay element 902 and a plurality of delay elements 904. A multiplexer 906 is coupled to select the output after a desired number of delay elements of the plurality of delay elements 904 based upon a delay select signal. The plurality of delay elements 904 may be a 64 tap delay line, for example. A multiplexer 910 is coupled to select the output of the delay element 902 and the multiplexer 906. The delay elements of FIG. 9 may be implemented in I/O blocks of the PLD described above with respect to FIG. 8, for example. The operation of the delay element according to one embodiment of the invention will be discussed in more detail below in reference to FIG. 10. While the delay element of FIG. 9 is shown by way of example, other delay elements may be implemented.

Because the method to achieve SET immunity described above may profit by the use of programmable delay blocks, the delay elements may be implemented in a PLD which allow the user to make trade-off between speed and the level of SET protection based upon the size of unwanted pulse. The delay block used to generate the delayed version of the clock may be programmed by the user to adjust the amount of delay so that the user may choose the trade-off between SET protection and performance. For example, in low earth orbit, a circuit may never see a glitch larger than 200 picoseconds (ps), so the delay only need be set to be 200 ps. But in deep space, a circuit may see a glitch up to 1 ns, so the delay needs to be set to be at least 1 ns. Note that in other embodiments, non-programmable delay blocks may be used.

Figure 10:
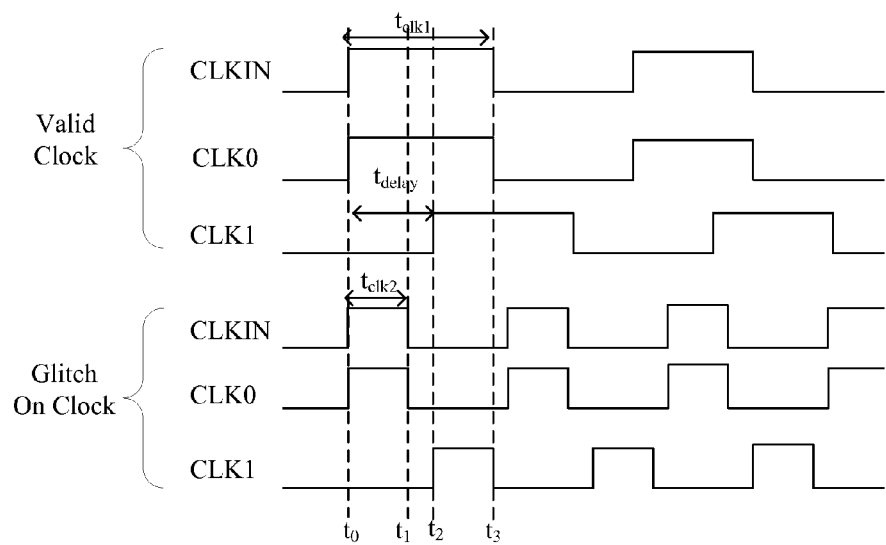
FIG. 10 is a timing diagram of the delay element of FIG. 9 according to an embodiment of the present invention.

A timing diagram of FIG. 10 for a delay element according to an embodiment of the present invention is shown. A CLKIN signal shows a clock signal having a pulse width $t_{clk1}$ between a time $t_0$ and $t_3$. However, if a glitch on the clock input shown by CLKIN having a width $t_{clk2}$ which is smaller than the delay, shown as $t_{delay}$ between times $t_0$ and $t_2$, the stored data will not be changed. That is, the clock and the delayed clock signal of the glitch will not overlap, which is required to change the value at a storage node. Accordingly, by selecting the delay between the clock signals to be greater than the width of an anticipated glitch, the circuits of FIGS. 1-6 will also provide set immunity. While the circuit of FIGS. 9 and 10 refer to a clock signal, the same circuits may also be used to generate delayed outputs for other signals.

Figure 11:
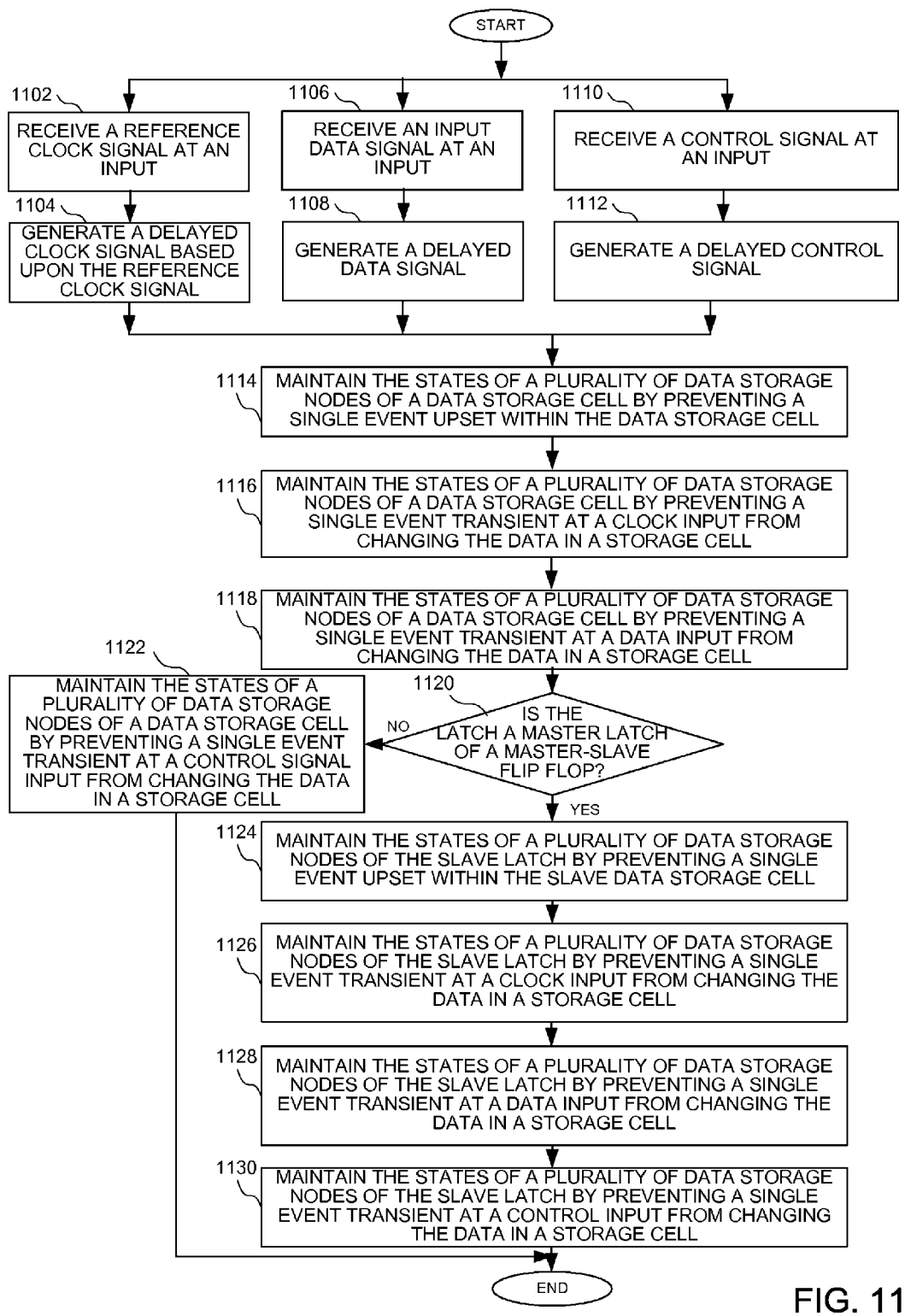
FIG. 11 is a flow chart showing a method of preventing an unintentional state change in a data storage node according to an embodiment of the present invention.

Turning now to FIG. 11, a flow chart shows a method of preventing an unintentional state change in a data storage node according to an embodiment of the present invention. In particular, a reference clock signal is received at an input at a step 1102. A delayed clock signal is generated based upon the reference clock signal at a step 1104. An input data signal is received at an input at a step 1106. A delayed data signal is generated at a step 1108. A control signal is received at an input at a step 1110, and a delayed control signal is generated at a step 1112. The control signal may be a set, reset, or enable signal, for example, or some other control signal.

The states of a plurality of data storage nodes of a data storage cell are maintained by preventing a single event upset within the data storage cell at a step 1114. The data is also maintained by preventing single event transients. In particular, the states of a plurality of data storage nodes of a data storage cell are maintained by preventing a single event transient at a clock input from changing the data in a storage cell at a step 1116. The states of a plurality of data storage nodes of a data storage cell are also maintained by preventing a single event transient at a data input from changing the data in a storage cell at a step 1118.

It is then determined whether the latch is a master latch of a master-slave flip-flop at a step 1120. If not, the states of a plurality of data storage nodes of a data storage cell are maintained by preventing a single event transient at a control input from changing the data in a storage cell at a step 1122. If so, the steps 1114-1118 would relate to a master latch, and the states of a plurality of data storage nodes of the slave latch are maintained by preventing a single event upset within the slave data storage cell at a step 1124. Single event transients are also prevented in the slave latch. In particular, the states of a plurality of data storage nodes of the slave latch are also maintained by preventing a single event transient at a clock input from changing the data in a storage cell at a step 1126. The states of a plurality of data storage nodes of the slave latch are maintained by preventing a single event transient at a data input from changing the data in a storage cell. at a step 1128. Finally, the states of a plurality of data storage nodes of the slave latch are maintained by preventing a single event transient at a control input from changing the data in a storage cell at a step 1130.

The method of FIG. 11 may be implemented using any of the circuits of FIGS. 1-10 as described above, or any other suitable circuits. Set, Reset, and Clock Enable of a complex flip-flop may also be implemented according to the embodiment of FIG. 11 with a decoder and an input multiplexer as shown in FIG. 6. According to the embodiment of FIG. 6, the delay block on the data path prevents any single event transient that happens on any control signal. No additional delay block is needed to implement Clock Enable and synchronous Set and Reset. To implement asynchronous Set and Reset using the scheme shown in FIG. 6, only one additional delay block and some logic gates are needed to make both the master and slave latch transparent, allowing data to flow through.

It can therefore be appreciated that a new and novel latch and method of preventing an unintentional state change in a data storage node has been described. While a conventional DICE memory cell is shown by way of example as a cell providing SEU protection, any other memory cell providing SEU protection could be employed according to embodiments of the present invention, allowing the circuits of the present invention to provide both SEU and SET protection. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of preventing an unintentional state change in a data storage node of a latch, the method comprising:
   receiving a reference input signal at a signal generator;
   coupling the reference input signal at a first output of the signal generator to control a first data storage node of the latch;
   generating, using the signal generator, a delayed input signal based upon the reference input signal, wherein the delayed input signal is offset relative to the reference input signal and a high state of the delayed input signal is generated at a time when a high state of the reference input signal is generated;
   coupling the delayed input signal at a second output of the signal generator to control a second data storage node of the latch;
   maintaining a state of the first data storage node of a plurality of data storage nodes by latching data at the first data storage node using the reference input signal; and
   maintaining a state of the second data storage node of the plurality of data storage nodes by latching data at the second data storage node using the delayed input signal.

2. The method of claim 1, wherein receiving the reference input signal and generating the delayed input signal comprise receiving a reference clock signal and generating a delayed clock signal.

3. The method of claim 1, wherein receiving the reference input signal and generating the delayed input signal comprise receiving a reference data signal and generating a delayed data signal.

4. The method of claim 1, further comprising enabling synchronous and asynchronous setting of data in the latch.

5. The method of claim 1, further comprising programming a delay element in a device having programmable resources, wherein the delay element generates the delayed input signal.

6. The method of claim 1, wherein the latch comprises a master latch of a master-slave flip-flop, and further comprising coupling a slave latch to the master latch.

7. The method of claim 1, wherein the method provides SET and SEU protection.

8. A method of preventing an unintentional state change in a data storage node of a latch, the method comprising:
- receiving a reference clock signal at a clock signal generator;
- coupling the reference clock signal at a first output of the clock signal generator to control a first data storage node of the latch;
- generating, using the clock signal generator, a delayed clock signal based upon the reference clock signal, wherein the delayed clock signal is offset relative to the reference clock signal and a high state of the delayed clock signal is generated at a time when a high state of the reference clock signal is generated;
- coupling the delayed clock signal at a second output of the clock signal generator to control a second data storage node of the latch;
- receiving an input data signal;
- generating a delayed data signal based upon the input data signal;
- maintaining a state of a first data storage node of a plurality of data storage nodes by latching data at the first data storage node using the reference clock signal and the input data signal; and
- maintaining a state of a second data storage node of the plurality of data storage nodes by latching data at the second data storage node using the delayed clock signal and the delayed data signal.

9. The method of claim 8, wherein maintaining the state of the first data storage node comprises latching data at the first data storage node using both the input data signal and the delayed data signal.

10. The method of claim 8, wherein maintaining the state of the second data storage node comprises latching data at the second data storage node using both the input data signal and the delayed data signal.

11. The method of claim 8, further comprising using both the reference clock signal and the delayed clock signal to change a state of a third data storage node of the plurality of data storage nodes.

12. The method of claim 11, further comprising using both the input data signal and the delayed data signal to change the state of the third data storage node.

13. The method of claim 8, wherein the latch comprises a master latch of a master-slave flip-flop, further comprising coupling a slave latch to the master latch.

14. The method of claim 13, wherein the method provides SET and SEU protection.

15. A latch for storing data in an integrated circuit, the latch comprising:
- a storage cell having a plurality of data storage nodes;
- an input terminal coupled to a first data storage node of the plurality of data storage nodes, the first data storage node storing data of an input data signal;
- a delay circuit coupled to receive a reference clock signal and output a delayed clock signal based upon the reference clock signal and a delay of the delay circuit, wherein the delayed clock signal is offset relative to the reference clock signal and a high state of the delayed clock signal is generated at a time when a high state of the reference clock signal is generated; and
- an output terminal coupled to a second data storage node of the plurality of data storage nodes, the storage cell receiving both the reference clock signal at a first input and the delayed clock signal at a second input, wherein the latch generates an output signal at the output terminal based upon the reference clock signal and the delayed clock signal.

16. The latch of claim 15, wherein the delay circuit comprises a programmable delay element of a device having programmable resources.

17. The latch of claim 15, further comprising a data generator comprising a delay circuit, the data generator being coupled to receive the input data signal and generate a delayed data signal.

18. The latch of claim 17, wherein the delay circuit of the data generator comprises a programmable delay element of a device having programmable resources.

19. The latch of claim 15, wherein the latch comprises a master latch of a master-slave flip-flop.

20. The latch of claim 19, further comprising a control signal circuit providing a control signal to a delay circuit to generate a delayed control signal, wherein a slave latch of the master-slave flip-flop is controlled based upon the control signal and the delayed control signal.

* * * * *